United States Patent
Yin

(10) Patent No.: US 10,845,858 B2
(45) Date of Patent: Nov. 24, 2020

(54) POWER SUPPLY DEVICE WITH AN ELECTRONIC CIRCUIT BREAKER AND METHOD FOR CONTROLLING THE SAME

(71) Applicant: ACBEL POLYTECH INC., New Taipei (TW)

(72) Inventor: Jen-Pei Yin, New Taipei (TW)

(73) Assignee: ACBEL POLYTECH INC., New Taipei (TW)

(*) Notice: Subject to any disclaimer, the term of this patent is extended or adjusted under 35 U.S.C. 154(b) by 141 days.

(21) Appl. No.: 16/189,284

(22) Filed: Nov. 13, 2018

(65) Prior Publication Data
US 2020/0019222 A1    Jan. 16, 2020

(30) Foreign Application Priority Data

Jul. 12, 2018   (TW) .............................. 107124093 A

(51) Int. Cl.
| | |
|---|---|
| *G06F 1/32* | (2019.01) |
| *G06F 1/28* | (2006.01) |
| *H02J 9/06* | (2006.01) |
| *H02J 50/10* | (2016.01) |
| *H03K 17/00* | (2006.01) |
| *G06F 1/3203* | (2019.01) |
| *G06F 1/3206* | (2019.01) |

(52) U.S. Cl.
CPC .................. *G06F 1/28* (2013.01); *G06F 1/32* (2013.01); *G06F 1/3203* (2013.01); *G06F 1/3206* (2013.01); *H02J 9/061* (2013.01); *H02J 50/10* (2016.02); *H03K 17/007* (2013.01)

(58) Field of Classification Search
CPC . G06F 1/28; G06F 1/32; G06F 1/3203; G06F 1/3206
USPC ...................... 307/11, 17, 112, 116, 125, 130
See application file for complete search history.

(56) References Cited

U.S. PATENT DOCUMENTS 5,336,985 A * 8/1994 McKenzie ................ G05F 1/56
                                                    307/34
5,920,466 A * 7/1999 Hirahara ........... H02M 3/33523
                                                    363/21.02

(Continued)

FOREIGN PATENT DOCUMENTS

| CN | 102055351 A | 5/2011 |
|---|---|---|
| CN | 104460376 A | 3/2015 |

(Continued)

*Primary Examiner* — Adi Amrany
(74) *Attorney, Agent, or Firm* — Birch, Stewart, Kolasch & Birch, LLP

(57) ABSTRACT

A power supply device includes a power output terminal, a power converter and an electronic circuit breaker. In view of operation of the electronic circuit breaker, when an electric appliance that acts as a load is connected between the power output terminal and a ground terminal, the electronic circuit breaker is activated to output voltage from the power converter to the power output terminal so as to charge the electric appliance. When the electric appliance is done with charging and is removed, the electronic circuit breaker is deactivated to prevent voltage of the power converter from being outputted to the power output terminal. Thus, even if the power output terminal is exposed, the power output terminal won't output power to result in electric shock because of users' inadvertent contact when no electric appliance is being charged, thereby enhancing operational safety.

18 Claims, 12 Drawing Sheets

(56) References Cited

U.S. PATENT DOCUMENTS

| | | | | |
|---|---|---|---|---|
| 7,852,641 B2* | 12/2010 | Kim | ............ | H02M 3/33561 363/21.14 |
| 8,310,846 B2* | 11/2012 | Piazzesi | ............ | H02M 3/33523 363/21.12 |
| 8,830,073 B2* | 9/2014 | Sims | ............ | G06F 1/3203 320/107 |
| 8,953,343 B2* | 2/2015 | Kim | ............ | H02M 3/33507 363/21.12 |
| 2001/0028570 A1* | 10/2001 | Mullett | ............ | H02M 3/33561 363/21.18 |
| 2005/0088858 A1* | 4/2005 | Kogel | ............ | H02M 3/33561 363/22 |
| 2013/0127248 A1* | 5/2013 | Lai | ............ | H02J 9/005 307/31 |
| 2013/0155737 A1* | 6/2013 | Jeong | ............ | H02M 7/04 363/78 |
| 2014/0223212 A1* | 8/2014 | Wu | ............ | G06F 1/266 713/323 |
| 2017/0033694 A1* | 2/2017 | Tseng | ............ | H02M 3/33561 |
| 2017/0244326 A1* | 8/2017 | Petrovic | ............ | H02M 3/33507 |
| 2018/0351468 A1* | 12/2018 | Greenwood | ............ | H02M 3/33507 |
| 2019/0068051 A1* | 2/2019 | Yang | ............ | H02M 3/158 |

FOREIGN PATENT DOCUMENTS

| | | |
|---|---|---|
| CN | 106655809 A | 5/2017 |
| CN | 206759038 U | 12/2017 |

\* cited by examiner

POWER SUPPLY DEVICE WITH AN ELECTRONIC CIRCUIT BREAKER AND METHOD FOR CONTROLLING THE SAME

BACKGROUND OF THE INVENTION

1. Field of the Invention

The present invention relates to a power supply device and method for controlling the same and, more particularly, to a power supply device with an electronic circuit breaker and a method for controlling the same.

2. Description of the Related Art

Modernized people are in possession of a lot of electric appliances at home. Generally, each electric appliance provides a power cable for the electric appliance to be connected to a power outlet and receive the mains power for normal operation through the power cable. Moreover, when being a portable one, the electric appliance can have a rechargeable battery installed therein to facilitate users' operation, such that the electric appliance can be operated in a portable way without the constraint of the power cable. After the battery is out of juice, the battery needs to be recharged again for subsequent operation.

Regular battery charging means is performed by providing a charging device in connection with a power outlet through a power cable to receive power from the power outlet, and the charging device has a set of first charging electrodes. When the rechargeable battery in the electric appliance runs out of power, users can have the electric appliance and the charging device connected with each other by connecting a set of second charging electrodes of the electric appliance to the set of first charging electrodes of the charging device. Thus, the rechargeable battery of the electric appliance can be charged by electrically connecting to the charging device through the set of first charging electrodes.

Given the sweeping robot for the electric appliance as an example, to facilitate the electrical connection of the sweeping robot toward a charging device, the set of first charging electrodes of the charging device is preferred to be exposed, allowing itself to be connected with the set of second charging electrodes. However, when the exposure of the set of first charging electrodes of the charging device becomes necessary, users may incur electric shock because of inadvertent contact therewith.

SUMMARY OF THE INVENTION

An objective of the present invention is to provide a power supply device with an electronic circuit breaker and a method for controlling the same to turn off the power from electrodes and circumvent the risk of electric shock as a result of users' inadvertent contact under the circumstance of no charging to any electric appliance.

To achieve the foregoing objective, the power supply device includes a power output terminal, a power converter and an electronic circuit breaker.

The power converter has a first voltage output terminal and a second voltage output terminal. The power converter performs a feedback control according to a voltage outputted from the second voltage output terminal.

The electronic circuit breaker has an electronic switch and a processor unit.

The electronic switch is connected between the power output terminal and the second voltage output terminal and has a control terminal for turning on or off the electronic switch.

The processor unit has a first input terminal, a second input terminal, a third input terminal, and a first output terminal.

The first input terminal and the second input terminal are respectively connected to the first voltage output terminal and the second voltage output terminal.

The third input terminal is connected to the power output terminal.

The first output terminal is connected to the control terminal of the electronic switch.

The processor unit performs a standby mode and determines if a voltage value of the power output terminal is less than an activation threshold. When determining that the voltage value of the power output terminal is less than the activation threshold, the processor unit generates an activation signal and outputs the activation signal from the first output terminal to turn on the electronic switch and connect the second voltage output terminal and the power output terminal. The processor unit further determines if a voltage value of the first voltage output terminal of the power converter is less than a deactivation threshold. When determining that the voltage value of the first voltage output terminal of the power converter is less than the deactivation threshold, the processor unit generates a deactivation signal and outputs the deactivation signal from the first output terminal to turn off the electronic switch and resumes the standby mode.

To achieve the foregoing objective, the method for controlling a power supply device, in which the power supply device includes a power output terminal, a power converter and an electronic circuit breaker and the power converter includes a first voltage output terminal and a second voltage output terminal, is performed by the electronic circuit breaker and includes:

receiving a first voltage outputted from a first voltage output terminal of the power converter and the second voltage outputted from the second voltage output terminal of the power converter;

receiving an output voltage of the power output terminal;

performing a standby mode;

determining if a voltage value of the output voltage of the power output terminal is less than an activation threshold;

when the voltage value of the output voltage of the power output terminal is less than the activation threshold, generating an activation signal to connect the second voltage output terminal to the power output terminal;

determining if a voltage value of the first voltage of the first voltage output terminal is less than a deactivation threshold;

when the voltage value of the first voltage of the first voltage output terminal is less than the deactivation threshold, generating a deactivation signal to disconnect the second output voltage terminal from the power output terminal and then performing the standby mode.

Given the operation of the electronic circuit breaker, when an electric appliance acts as a load in connection to the power output terminal and the voltage value of the power output terminal is less than the activation threshold, the processor unit activates the electronic switch to turn on to connect the second voltage output terminal of the power converter to the power output terminal for charging the electric appliance. When the electric appliance is done with charging and is removed, the current charging the electric appliance is fed back to the second voltage output terminal of the power converter to temporarily stop operation of the power converter and allow the voltage value of the first voltage output terminal of the power converter to be less than the deactivation threshold. Meanwhile, the processor unit generates the deactivation signal to deactivate the electronic switch and disconnect the second voltage output terminal from the power output terminal. Under the circumstance, even if the power output terminal is exposed, when no electric appliance is charged, the power output terminal supplies no power. Accordingly, users won't incur electric shock because of their inadvertent contact with the exposed power output terminal to attain enhancement of operational safety.

Other objectives, advantages and novel features of the invention will become more apparent from the following detailed description when taken in conjunction with the accompanying drawings.

DETAILED DESCRIPTION OF THE INVENTION

Figure 1:
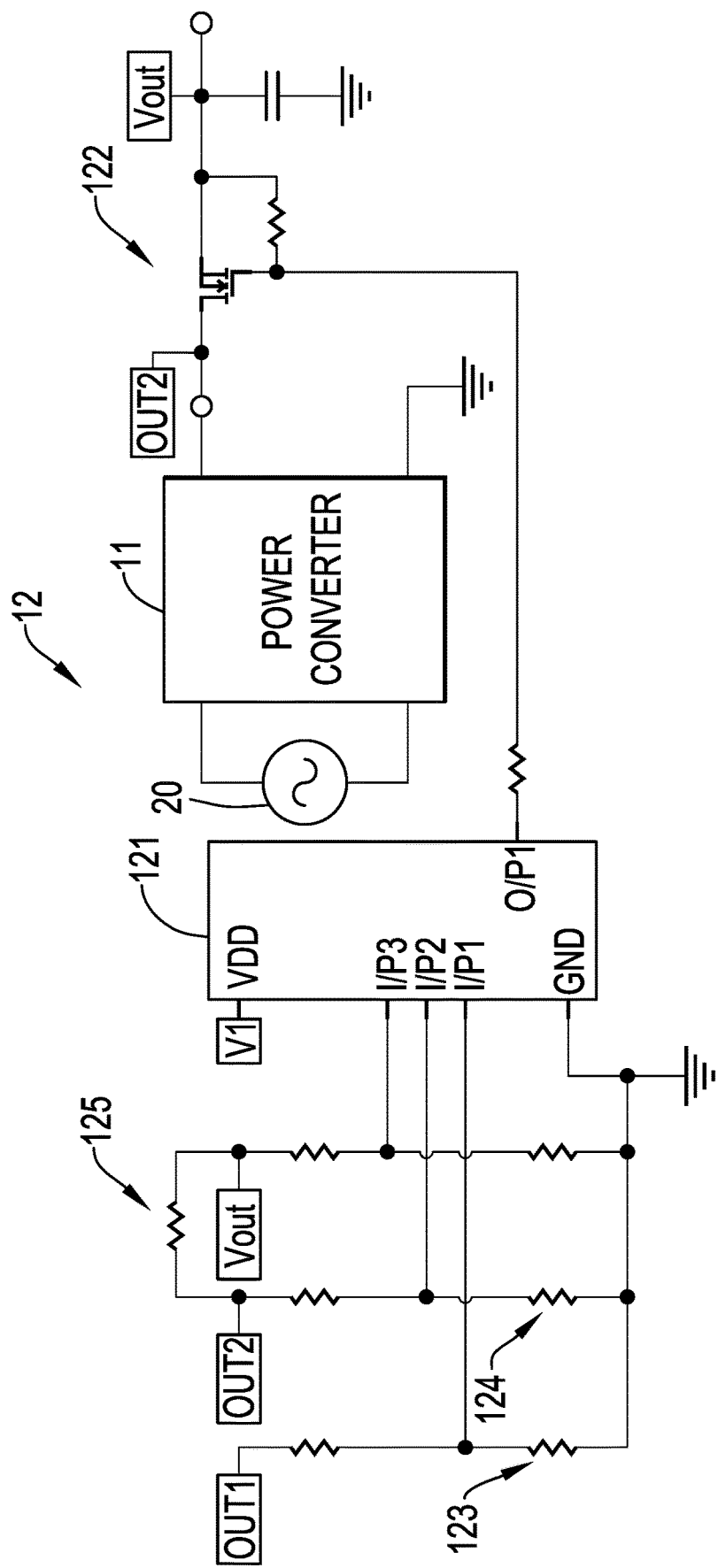
FIG. 1 is a circuit diagram of a first embodiment of a power supply device with an electronic circuit breaker in accordance with the present invention.
Figure 2:
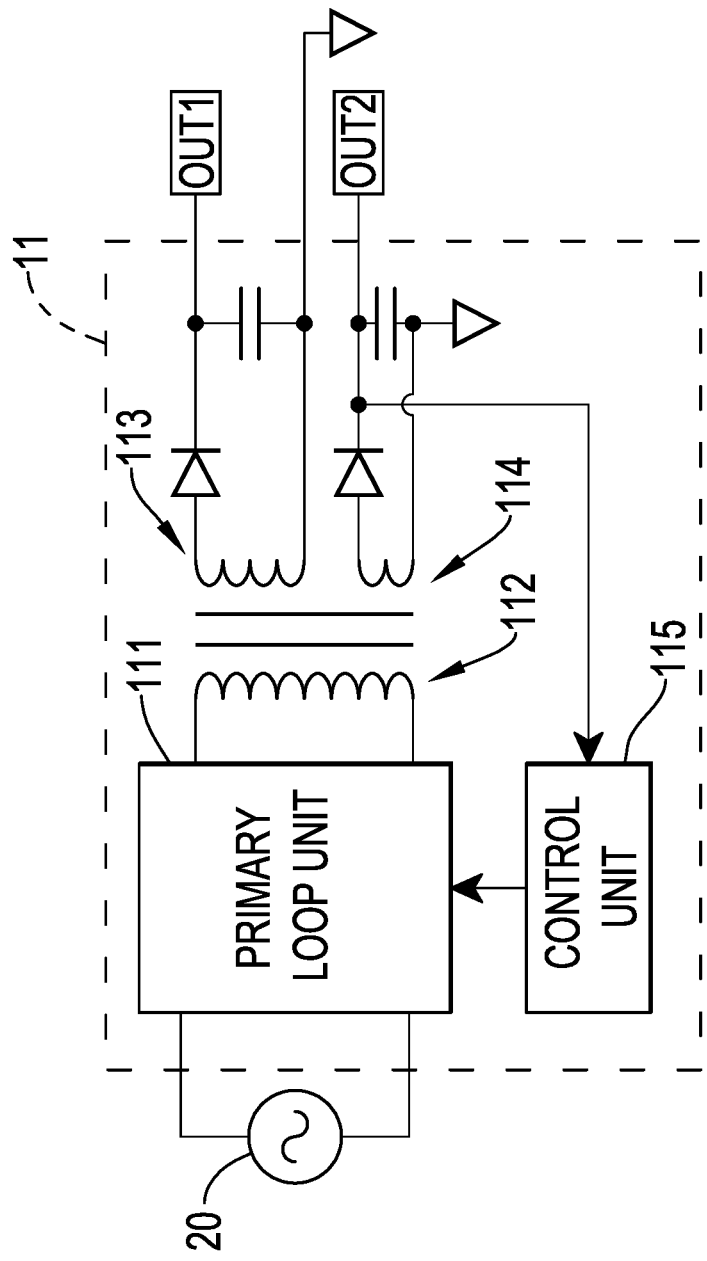
FIG. 2 is a circuit diagram of a power converter of the power supply device in FIG. 1.

With reference to FIGS. 1 and 2, a first embodiment of a power supply device with an electronic circuit breaker in accordance with the present invention includes a power output terminal Vout, a power converter 11 and an electronic circuit breaker 12. In the present embodiment, the power converter 11 is a DC (Direct Current) to DC converter.

The power converter 11 includes a first voltage output terminal OUT1 and a second voltage output terminal OUT2. The power converter 11 performs a feedback control according to an output voltage of the second voltage output terminal OUT2.

The electronic circuit breaker 12 includes a processor unit 121 and an electronic switch 122.

The electronic switch 122 is connected between the power output terminal Vout and the second voltage output terminal OUT2 and has a control terminal to turn on/off the electronic switch 122. The processor unit 121 has a first input terminal I/P1, a second input terminal I/P2, a third input terminal I/P3 and a first output terminal O/P1.

The first input terminal I/P1 is connected to the first voltage output terminal OUT1. The second input terminal I/P2 is connected to the second voltage output terminal OUT2. The third input terminal I/P3 is connected to the power output terminal Vout. The first output terminal O/P1 is connected to the control terminal of the electronic switch 122.

The processor unit 121 performs a standby mode and determines if a voltage value of the power output terminal Vout is less than an activation threshold. When determining that the voltage value of the power output terminal Vout is less than the activation threshold, the processor unit 121 generates an activation signal and outputs the activation signal through the first output terminal O/P1 to turn on the electronic switch 122, so as to connect the second voltage output terminal OUT2 and the power output terminal Vout. The processor unit 121 further determines if a voltage value of the first voltage output terminal OUT1 of the power converter 11 is less than a deactivation threshold. When determining that the voltage value of the first voltage output terminal OUT1 is less than the deactivation threshold, the processor unit 121 generates a deactivation signal and outputs the deactivation signal through the first output terminal O/P1 to turn off the electronic switch 122 and resume the standby mode again.

In view of operation of the electronic circuit breaker 12, when an electric appliance acts as a load connected between the power output terminal Vout and a ground terminal GND and the voltage value of the power output terminal drops and is less than the activation threshold, the processor unit 121 turns on the electronic switch 122 for the second voltage output terminal OUT2 of the power converter 11 to be connected to the power output terminal Vout to charge the electric appliance. After the electric appliance is done with charging and is removed, current charging the electric appliance is fed back to the second voltage output terminal OUT2 of the power converter 11 to pause operation of the power converter 11, allowing the voltage value of the first voltage output terminal OUT1 of the power converter 11 to drop below the deactivation threshold. In the meantime, the processor unit 121 generates the deactivation signal to turn off the electronic switch 122 so as to disconnect the second voltage output terminal OUT from the power output terminal Vout. Thus, despite the power output terminal Vout exposed beyond an enclosure of the power supply device, operational safety can be enhanced by prevention of electric shock as a result of users' inadvertent contact with the power output terminal Vout because the power output terminal Vout supplies no power when the electric appliance is not charged.

With reference to FIG. 2, the power converter 11 includes a primary loop unit 111, a primary coil 112, a first secondary coil 113, a second secondary coil 114, and a control unit 115.

The primary loop unit 111 is electrically connected to a power source 20 to input AC (Alternating Current) power therein. The primary coil 112 is electrically connected to the primary loop unit 111. The first secondary coil 113 is inductively coupled to the primary coil 112 and is connected to the first voltage output terminal OUT1 to output the first voltage through the first voltage output terminal OUT1. The second secondary coil 114 is inductively coupled to the primary coil 112 and is connected to the second voltage output terminal OUT2 to output the second voltage through the second voltage output terminal OUT2. The first secondary coil 113 is greater than the second secondary coil 114 in number of turns. The control unit 115 is electrically connected to the second secondary coil 114 and the primary loop unit 111 and generates a control signal to control the primary loop unit 111 according to the second voltage outputted from the second secondary coil 114. In the present embodiment, the control signal is a pulse width modulation (PWM) signal.

Additionally, the power supply device further includes a power factor converter for the primary loop unit 111 of the power converter 11 to electrically connect to the power source 20 through the power factor converter.

Figure 3:
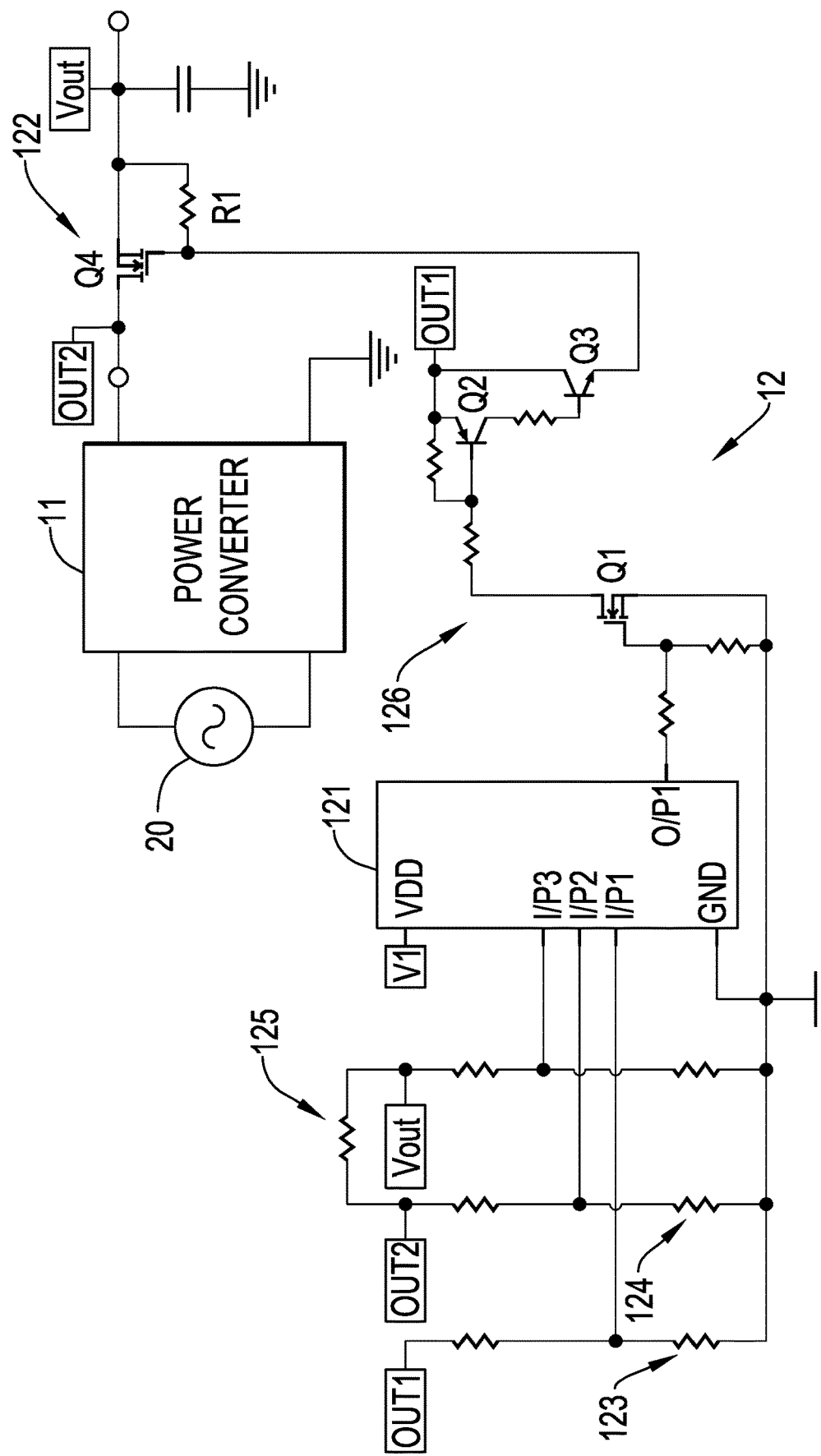
FIG. 3 is a circuit diagram of a second embodiment of a power supply device with an electronic circuit breaker in accordance with the present invention.

With reference to FIG. 3, a second embodiment of a power supply device with an electronic circuit breaker in accordance with the present invention differs from the first embodiment in that the electronic circuit breaker 12 further includes a first voltage divider circuit 123, a second voltage divider circuit 124, a third voltage divider circuit 125 and a switching circuit 126.

The first input terminal I/P1 is connected to the first voltage output terminal OUT1 through the first voltage divider circuit 123. The second input terminal I/P2 is connected to the second output terminal OUT2 through the second voltage divider circuit 124. The third input terminal I/P3 is connected to the power output terminal Vout and the second voltage output terminal OUT2 through the third voltage divider circuit 125.

The first output terminal O/P1 of the processor unit 121 is connected to the control terminal of the electronic switch 122 through the switching circuit 126. The switching circuit 126 includes a first transistor Q1, a second transistor Q2 and a third transistor Q3.

The first transistor Q1 has a drain, a gate and a source. The gate of the first transistor Q1 is electrically connected to the first output terminal O/P1 of the processor unit 121. The source of the first transistor Q1 is electrically connected to the ground terminal GND. The second transistor Q2 has an emitter, a base and a collector. The emitter of the second transistor Q2 is connected to the first voltage output terminal OUT1. The base of the second transistor Q2 is connected to the drain of the first transistor Q1. The third transistor Q3 has an emitter, a base and a collector. The collector of the third transistor Q3 is electrically connected to the first voltage output terminal OUT1. The base of the third transistor Q3 is electrically connected to the collector of the second transistor Q2.

The electronic switch 122 includes a first resistor R1 and a fourth transistor Q4.

The fourth transistor Q4 has a drain, a gate and a source. The drain of the fourth transistor Q4 is electrically connected to the second voltage output terminal OUT2. The gate of the fourth transistor Q4 is electrically connected to the emitter of the third transistor Q3. The source of the fourth transistor Q4 is electrically connected to the power output terminal Vout. The gate of the fourth transistor Q4 is the control terminal of the electronic switch 122 and is electrically connected to the source of the fourth transistor Q4 through the first resistor R1.

Operation of the power supply device with the electronic circuit breaker in accordance with the present invention is elaborated as follows.

When the electric appliance is not electrically connected to the power output terminal Vout for charging, the processor unit 121 performs the standby mode, and a divided voltage is generated by applying the second voltage that is outputted from the second voltage output terminal OUT2 across the third voltage divider circuit 125 and is provided to the power output terminal Vout.

When the electric appliance is electrically connected between the power output terminal Vout and the ground terminal GND, because the electric appliance is connected in parallel to the third voltage divider circuit 125, a divided voltage generated by applying the second voltage outputted from the second voltage output terminal OUT2 across the third voltage divider circuit 125 drops. In other words, a present voltage value of the power output terminal Vout goes down and is less than the activation threshold, such that the processor unit 121 generates the activation signal and outputs the activation signal from the first output terminal O/P1 to the gate of the first transistor Q1.

As the gate of the first transistor Q1 receives the activation signal, the first transistor Q1 is turned on, and in turn the base of the second transistor Q2 is grounded for the second transistor Q2 to turn on. Subsequently, the base of the third transistor Q3 is electrically connected to the first voltage output terminal OUT1 to turn on the third transistor Q3. Furthermore, the gate of the fourth transistor Q4 is connected to the first voltage output terminal OUT1 to turn on the fourth transistor Q4.

Specifically, when the third transistor Q3 is turned on, the first voltage output terminal OUT1 is electrically connected to the ground terminal GND sequentially through the first resistor R1 and the third voltage divider circuit 125 to form a loop with current flowing therethrough. Therefore, a voltage difference between the gate and the source of the fourth transistor Q4 is generated through the first resistor R1 to form a conducting channel between the drain and the source of the fourth transistor Q4, such that the second voltage outputted from the second voltage output terminal OUT2 can be outputted to the power output terminal Vout through the fourth transistor Q4 to charge the electric appliance electrically connected to the power output terminal Vout.

In addition, as the power converter 11 performs the feedback control according to the voltage outputted from the second voltage output terminal OUT2, meaning that the second voltage output terminal OUT2 is a major feedback loop of the power converter 11, the control unit 115 of the power converter 11 determines whether the control signal should be outputted or not according to the voltage of the major feedback loop, i.e. the second voltage outputted from the second voltage output terminal OUT2. When the second voltage exceeds a threshold value, it indicates that the output voltage of the power converter 11 is high. Hence, the control unit 115 temporarily stops outputting the control signal to restore the output voltage of the power converter 11 to a normal voltage value, which is lower than the threshold value. When the second voltage does not exceed the threshold value, the control unit 115 then continuously outputs the control signal for the power converter 11 to output the first voltage and the second voltage.

When the electric appliance is removed, the current flowing through the loop formed by electrically connecting the first voltage output terminal OUT1 to the ground terminal GND through the first resistor R1 and the third voltage divider circuit 125 changes to flow in a reverse direction for the sake of the removal of the electric appliance and is fed back to the second voltage output terminal OUT2 for the second voltage outputted from the second voltage output terminal OUT2 in excess of the threshold value. Meanwhile, as the second voltage outputted from the second voltage output terminal OUT2 exceeds the threshold value, the control unit 115 temporarily stops outputting the control signal. When the control unit 115 outputs no control signal, the first secondary coil 113 and the second secondary coil 114 are not coupled to the primary coil 112, resulting in no generation of induced voltage. On the other hand, the first voltage outputted from the first voltage output terminal OUT1 starts dropping. Nevertheless, as the second voltage output terminal OUT2 receives the reverse current which is fed back from the loop, the second voltage outputted from the second voltage output terminal OUT2 can be kept exceeding the threshold value.

Since the first voltage outputted from the first output voltage terminal OUT1 starts dropping, when determining that the voltage outputted from the first voltage output terminal OUT1 is less than the deactivation threshold, the processor unit generates the deactivation signal and outputs the deactivation signal from the first output terminal O/P1 to the gate of the first transistor Q1 to turn off the first transistor Q1 and in turn to turn off the fourth transistor Q4 for the electronic circuit breaker 12 to go back to the standby mode.

In sum, by virtue of the operation of the electronic circuit breaker 12, when the electric appliance acts as a load in connection between the power output terminal Vout and the ground terminal GND, the electronic circuit breaker 12 can then be activated, allowing that the second voltage of the second voltage output terminal OUT2 of the power converter 11 can be outputted to the power output terminal Vout to thereby charge the electric appliance. When the electric appliance is done with charging and is removed, the electronic circuit breaker 12 can then be deactivated so as to disconnect the second voltage output terminal OUT2 of the power converter 11 from the power output terminal Vout. As such, operational safety can be enhanced by prevention of electric shock as a result of users' inadvertent contact with the power output terminal Vout because the power output terminal Vout supplies no power when the electric appliance is not charged.

Figure 4:
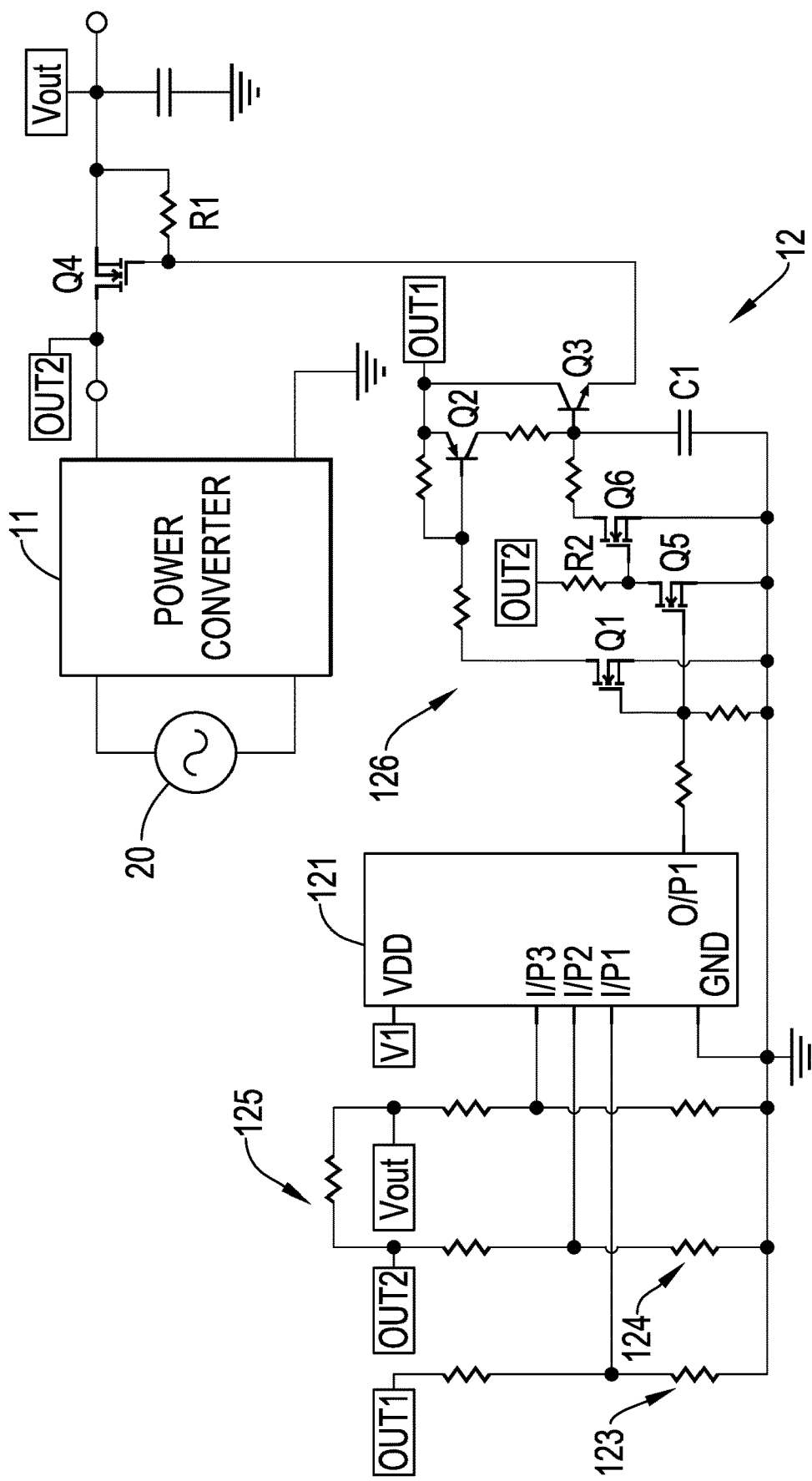
FIG. 4 is a circuit diagram of a third embodiment of a power supply device with an electronic circuit breaker in accordance with the present invention.

With reference to FIG. 4, a third embodiment of a power supply device with an electronic circuit breaker in accordance with the present invention differs from the second embodiment in that the electronic circuit breaker 12 further includes a fifth transistor Q5, a sixth transistor Q6, a second resistor R2 and a first capacitor C1.

The fifth transistor Q5 has a drain, a gate and a source. The gate of the fifth transistor Q5 is electrically connected to the first output terminal O/P1 of the processor unit 121. The source of the fifth transistor Q5 is electrically connected to the ground terminal GND. The sixth transistor Q6 has a drain, a gate and a source. The drain of the sixth transistor Q6 is electrically connected to the base of the third transistor Q3. The gate of the sixth transistor Q6 is electrically connected to the drain of the fifth transistor Q5. The source of the sixth transistor Q6 is electrically connected to the ground terminal GND. The second voltage output terminal OUT2 is electrically connected to the drain of the fifth transistor Q5 through the second resistor R2. The first capacitor C1 is electrically connected between the base of the third transistor Q3 and the ground terminal GND.

The gate and the source of the fifth transistor Q5 are identical to those of the first transistor Q1 in terms of their connection means. When the fifth transistor Q5 is turned on, the base of the sixth transistor Q6 is connected to the ground terminal GND for the sixth transistor Q6 to turn off. Moreover, as mentioned earlier, when the first transistor Q1 is turned on, the second transistor Q2 is also turned on. Thus, the first voltage output terminal OUT1 can then charge the first capacitor C1 through the second transistor Q2, and the voltage of the base of the third transistor Q3 slowly increases with the charging of the first capacitor C1 for the electronic circuit breaker 12 to be activated by way of soft start. The increasing speed of the voltage of the base of the third transistor Q3 depends on the capacitance value of the first capacitor C1. Therefore, users can set up a soft start time of the electronic circuit breaker 12 by choosing a corresponding capacitance value of the first capacitor C1.

Figure 5:
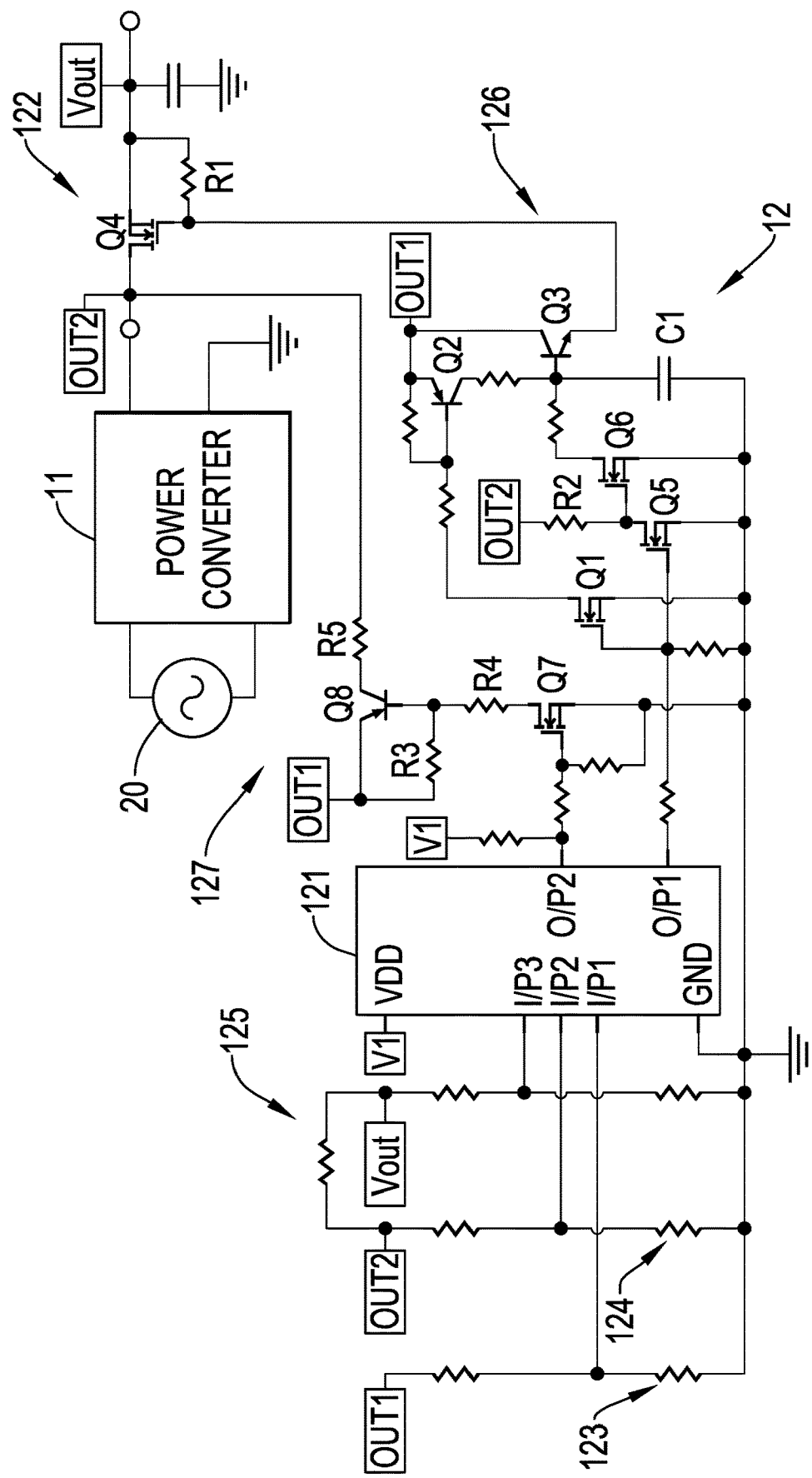
FIG. 5 is a circuit diagram of a fourth embodiment of a power supply device with an electronic circuit breaker in accordance with the present invention.

With reference to FIG. 5, a fourth embodiment of a power supply device with an electronic circuit breaker in accordance with the present invention differs from the third embodiment in that the electronic circuit breaker 12 further includes a feedback current generation circuit 127. The feedback current generation circuit 127 has a seventh transistor Q7, an eighth transistor Q8, a third resistor R3, a fourth resistor E4 and a fifth resistor R5.

The seventh transistor Q7 has a drain, a gate and a source. The gate of the seventh transistor Q7 is electrically connected to a second output terminal O/P2 of the processor unit 121. The gate of the seventh transistor Q7 is electrically connected to the ground terminal GND. The eighth transistor Q8 has an emitter, a base and a collector. The emitter of the eighth transistor Q8 is electrically connected to the first voltage output terminal OUT1.

The emitter of the eighth transistor Q8 is electrically connected to the base of the eighth transistor Q8 through the third resistor R3. The base of the eighth transistor Q8 is electrically connected to the drain of the seventh transistor Q7 through the fourth resistor R4. The collector of the eighth transistor Q8 is electrically connected to the voltage output terminal Vout through the fifth resistor R5. In the present embodiment, specifically, the collector of the eighth transistor Q8 is electrically connected to the drain of the fourth transistor Q4 through the fifth resistor R5.

When determining that the voltage value of the power output terminal Vout is less than the activation threshold, the processor unit 121 generates a feedback current start signal and outputs the feedback current start signal from the second output terminal O/P2 to turn on the seventh transistor Q7 and the eighth transistor Q8.

When determining that the voltage value of the first voltage output terminal OUT1 is less than the deactivation threshold, the processor unit 121 generates a feedback current cutoff signal and outputs the feedback current cutoff signal from the second output terminal O/P2 to turn off the seventh transistor Q7 and the eighth transistor Q8.

Taken as an example for explanation, when the electric appliance is electrically connected to the power output terminal Vout for charging, besides generating the activation signal to turn on the fourth transistor Q4, the processor unit 121 further generates the feedback current start signal and outputs the feedback current start signal from the second output terminal O/P2 to the gate of the seventh transistor Q7. As the seventh transistor Q7 is turned on by the received feedback current start signal, the eighth transistor Q8 is subsequently turned on, and the first voltage output terminal OUT1 is connected to the drain of the fourth transistor Q4 through the eighth transistor Q8 and the fifth resistor R5 to generate a feedback current charging the electric appliance through the fourth transistor Q4.

However, when the electric appliance is removed, the feedback current fails to be kept outputting to the power output terminal Vout. Instead, the feedback current flows in a reverse direction and is fed back to the second voltage output terminal OUT2. The feedback current to the second voltage output terminal OUT2 lets the second voltage outputted from the second voltage output terminal OUT2 exceed the threshold value to temporarily stop the control unit 115 of the power converter 11 from outputting the control signal, thus allowing the voltage value of the first voltage output terminal OUT1 to start dropping below the deactivation threshold.

Moreover, when the electric appliance is removed, besides generating the turn-off signal to turn off the fourth transistor Q4, the processor unit 121 further generates the feedback current cutoff signal and outputs the feedback current cutoff signal from the second output terminal O/P2 to the seventh transistor Q7. As the seventh transistor Q7 is turned off by the received feedback current cutoff signal, the eighth transistor Q8 is subsequently turned off to stop from generating the feedback current.

The feedback current generation circuit 127 is provided to increase the current fed back to the second voltage output terminal OUT2 and to shorten a determination time of temporarily stop the control unit 115 of the power converter 11 from outputting the control signal, so as to raise a working efficiency.

Figure 6:
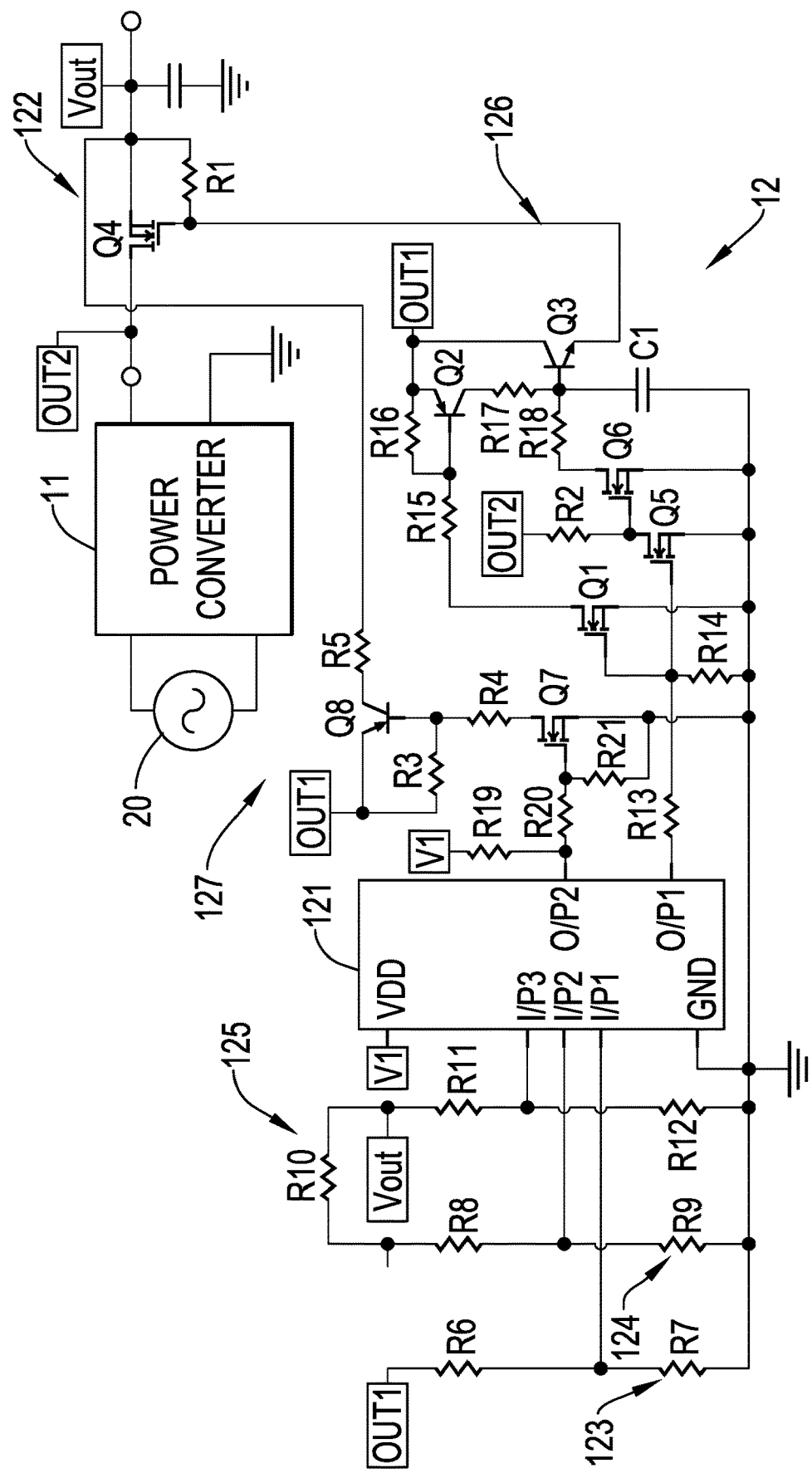
FIG. 6 is a circuit diagram of a fifth embodiment of a power supply device with an electronic circuit breaker in accordance with the present invention.

With reference to FIG. 6, a fifth embodiment of a power supply device with an electronic circuit breaker in accordance with the present invention differs from the fourth embodiment in that the eighth transistor Q8 of the feedback current generation circuit 127 of the electronic circuit breaker 12 is electrically connected to the source of the fourth transistor Q4.

Furthermore, in the first to fifth embodiments after generating the activation signal and outputting the activation signal to the first output terminal O/P1, the processor unit 121 further determines if the voltage value of the power output terminal Vout is less than a short-circuit threshold.

When determining that the voltage value of the power output terminal Vout is less than the short-circuit threshold, the processor unit 121 generates the deactivation signal and outputs the deactivation signal from the first output terminal O/P1 to turn off the electronic switch 122. The processor unit 121 further determines if the voltage value of the power output terminal Vout is greater than a standby threshold. When determining that the voltage value of the power output terminal Vout is greater than the standby threshold, the processor unit 121 resumes the standby mode.

When determining that the voltage value of the power output terminal Vout is not less than the short-circuit threshold, the processor unit 121 then starts determining if the voltage value of the first voltage output terminal OUT1 is less than the deactivation threshold. Subsequent operation is mentioned earlier and is not repeated here.

When users inadvertently touch the exposed power output terminal Vout to result in short-circuit between the power output terminal Vout and the ground terminal GND, the voltage value of the power output terminal Vout is identical to that of the ground terminal GND, which is 0 volt. When short-circuit occurs between the power output terminal Vout and the ground terminal GND, the processor unit 121 determines that the voltage value of the power output terminal Vout is less than the activation threshold and further generates the activation signal to turn on the electronic switch. However, instead of being a desired situation that the power output terminal Vout is connected to the electric appliance for charging, the undesired situation is caused by users' inadvertent contact.

To circumvent the inadvertent activation, after determining that the voltage value of the power output terminal Vout is less than the activation threshold and generating the activation signal, the processor unit 121 further determines if the voltage value of the power output terminal Vout is less than the short-circuit threshold. When the processor unit 121 determines that the voltage value of the power output terminal Vout is less than the short-circuit threshold, it indicates that an inadvertent activation is happening. Hence, the processor unit 121 then generates the deactivation signal to turn off the electronic switch 122. When the processor unit 121 determines that the voltage value of the power output terminal Vout is less than the activation threshold and is greater than the short-circuit threshold, it indicates that a normal activation is taking place.

After determining that the voltage value of the power output terminal Vout is less than the short-circuit threshold and generating the deactivation signal to turn off the electronic switch 122, the processor unit 121 further determines if the short-circuit situation has been removed. Thus, after determining that the voltage value of the power output terminal Vout is less than the short-circuit threshold and generating the deactivation signal to turn off the electronic switch 122, the processor unit 121 further determines if the voltage value of the power output terminal Vout is greater than the standby threshold. When the voltage value of the power output terminal Vout is determined to be greater than the standby threshold, it indicates that the short-circuit situation has been removed. Then, the processor unit 121 resumes the standby mode. In the present embodiment, the standby threshold is greater than the short-circuit threshold.

With further reference to FIG. 6, the first voltage divider circuit 123 includes a sixth resistor R6 and a seventh resistor R7. The first voltage output terminal OUT1 is electrically connected to the first input terminal I/P1 of the processor unit 121. The first input terminal I/P1 of the processor unit 121 is electrically connected to the ground terminal GND through the seventh resistor R7.

The seventh voltage divider circuit 124 includes an eighth resistor R8 and a ninth resistor R9. The second voltage output terminal OUT2 is electrically connected to the second input terminal I/P2 of the processor unit 121 through the eighth resistor R8. The second input terminal I/P2 of the processor unit 121 is electrically connected to the ground terminal GND through the ninth resistor R9.

The third voltage divider circuit 125 includes a tenth resistor R10, an eleventh resistor R11 and a twelfth resistor R12. The second voltage output terminal OUT2 is electrically connected to the power output terminal Vout through the tenth resistor R10. The power output terminal Vout is electrically connected to the third input terminal I/P3 of the processor unit 121 through the eleventh resistor R11. The third input terminal I/P3 of the processor 121 is electrically connected to the ground terminal GND through the twelfth resistor R12.

The switching circuit 126 of the electronic circuit breaker 12 includes a thirteenth resistor R13, a fourteenth resistor R14, a fifteenth resistor R15, a sixteenth resistor R16, a seventeenth resistor R17, and an eighteenth resistor R18.

The gate of the first transistor Q1 is electrically connected to the first output terminal I/P1 of the processor unit 121 and is electrically connected to the ground terminal GND through the fourteenth resistor R14. The base of the second transistor Q2 is electrically connected to the drain of the first transistor Q1 through the fifteenth resistor R15 and is electrically connected to the emitter of the second transistor Q2 through the sixteenth resistor R16. The collector of the second transistor Q2 is electrically connected to the base of the third transistor Q3 through the seventeenth resistor R17 and is electrically connected to the base of the third transistor Q3 through the eighteenth resistor R18.

The feedback current generation circuit 127 of the electronic circuit breaker 12 includes a nineteenth resistor R19, a twentieth resistor R20 and a twenty-first resistor R21. A power terminal VDD of the processor unit 121 is electrically connected to the second output terminal O/P2 of the processor unit 121 through the nineteenth resistor R19. The second output terminal O/P2 of the processor unit 121 is electrically connected to the gate of the seventh transistor Q7 through the twentieth resistor R20. The gate of the seventh transistor Q7 is electrically connected to the source of the seventh transistor Q7 through the twenty-first resistor R21.

Figure 7:
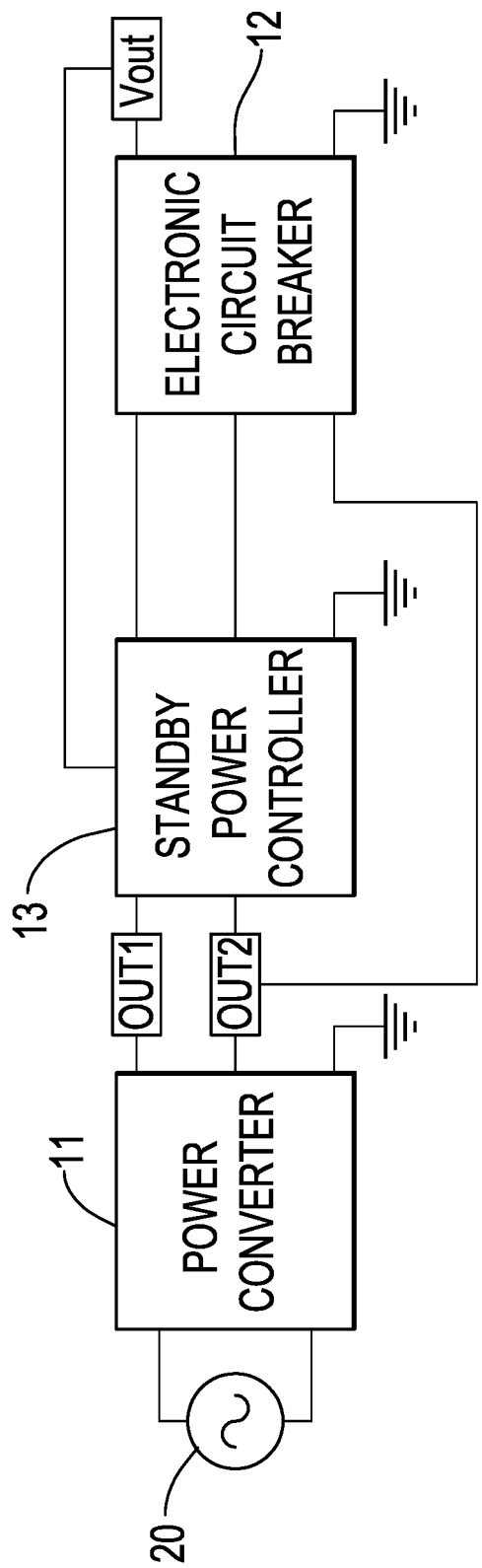
FIG. 7 is a circuit block diagram of a power supply device with a standby power controller in accordance with the present invention.
Figure 8:
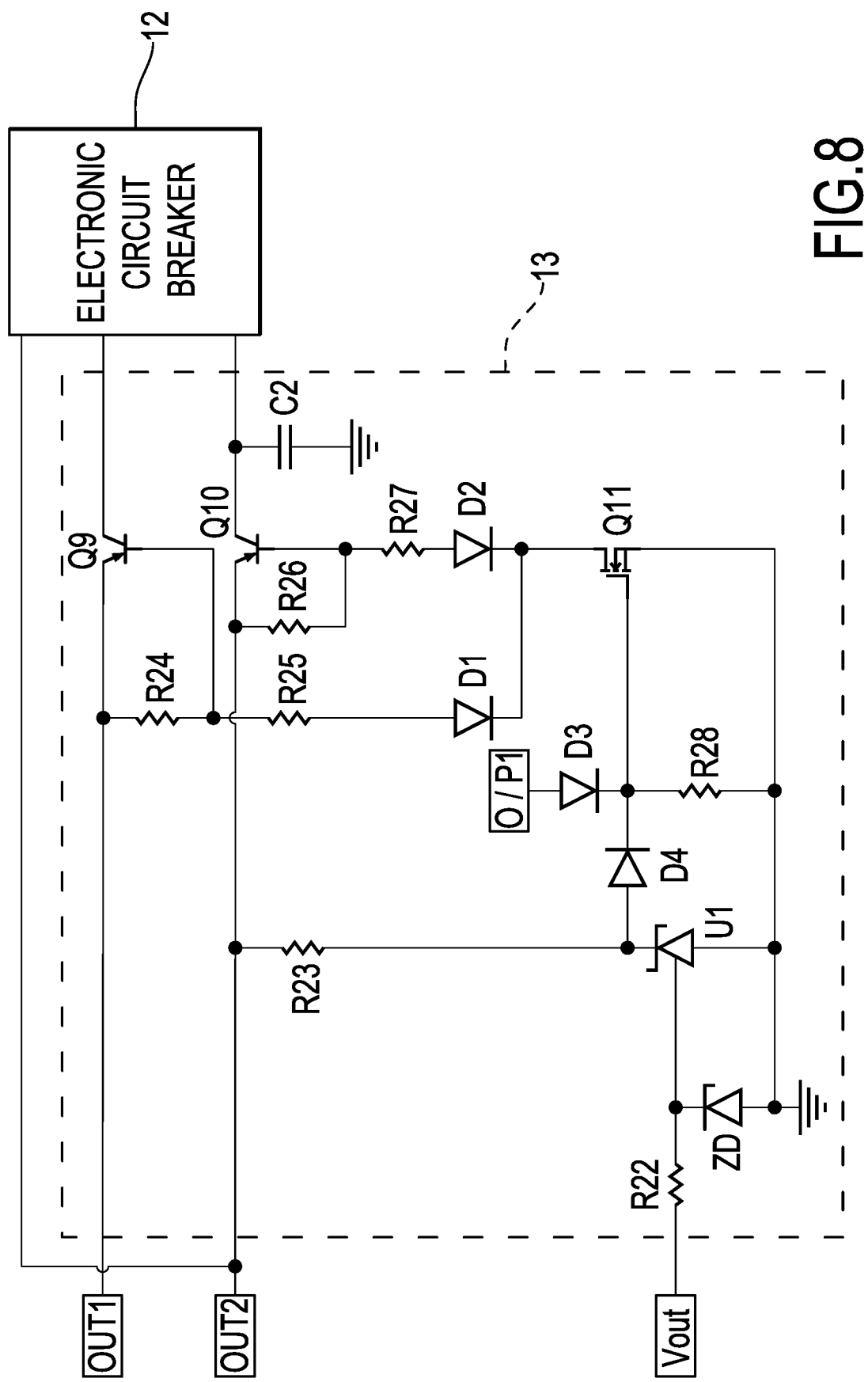
FIG. 8 is a circuit diagram of the standby power controller in FIG. 7.

With reference to FIGS. 7 and 8, the foregoing embodiments of the power supply device with the electronic circuit breaker may additionally include a standby power controller 13. The standby power controller 13 is connected between the power converter 11 and the electronic circuit breaker 12. The electronic switch 122 of the electronic circuit breaker 112 is connected to the second voltage output terminal OUT2 of the power converter 11 through the standby power controller 13. The first input terminal I/P1 of the processor unit 121 of the electronic circuit breaker 12 is connected to the first voltage output terminal OUT1 through the standby power controller 13. The second input terminal IP2 of the processor unit 121 of the electronic circuit breaker 12 is directly connected to the second voltage output terminal OUT2 of the power converter 11. When the voltage value of the power output terminal Vout is greater than the activation threshold, the standby power controller 13 disconnects the power converter 11 from the electronic circuit breaker 12. Furthermore, when the standby power controller 13 is connected between the power converter 11 and the electronic circuit breaker 12, it is only the second input terminal I/P2 of the processor unit 121 of the electronic circuit breaker 12 is directly connected to the second voltage output terminal OUT2 of the power converter 11.

The standby power controller 13 includes a ninth transistor Q9, a tenth transistor Q10, an eleventh transistor Q11, a switching unit U1, a Zener diode ZD, a first diode D1, a second diode D2, a third diode D3, a fourth diode D4, a second capacitor C1, a twenty-second resistor R22, a twenty-third resistor R23, a twenty-fourth resistor R24, a twenty-fifth resistor R25, a twenty-sixth resistor R26, a twenty-seventh resistor R27, and a twenty-eighth resistor R28.

The ninth transistor Q9 has an emitter, a base and a collector. The emitter of the ninth transistor Q9 is electrically connected to the first voltage output terminal OUT1. The collector of the ninth transistor Q9 is electrically connected to the first input terminal I/P1 of the processor unit 121 of the electronic circuit breaker 12. The tenth transistor Q10 has an emitter, a base and a collector. The emitter of the tenth transistor Q10 is electrically connected to the second voltage output terminal OUT2. The collector of the tenth transistor Q10 is electrically connected to the electronic switch 122 of the electronic circuit breaker 12.

The eleventh transistor Q11 has a drain, a gate and a source. The source of the eleventh transistor Q11 is electrically connected to the ground terminal GND.

The power output terminal Vout is electrically connected to a control terminal of the switching unit U1 through the twenty-second resistor R22. The control terminal of the switching unit U1 is electrically connected to the ground terminal GND through the Zener diode ZD.

The second voltage output terminal OUT2 is electrically connected to the ground terminal GND through the twenty-third resistor R23 and the switching unit U1 and is electrically connected to the gate of the eleventh transistor Q11 through the twenty-third resistor R23 and the fourth diode D4.

The first output terminal O/P1 is electrically connected to the gate of the eleventh transistor Q11 through the third diode D3. The twenty-eighth resistor R28 is electrically connected between the gate and the source of the eleventh transistor Q11.

The emitter of the ninth transistor Q9 is electrically connected to the base of the ninth transistor Q9 through the twenty-fourth resistor R24. The base of the ninth transistor Q9 is electrically connected to the drain of the eleventh transistor Q11 through the twenty-fifth resistor R25 and the first diode D1.

The emitter of the tenth transistor Q10 is electrically connected to the base of the tenth transistor Q10 through the twenty-sixth resistor R26. The base of the tenth transistor Q10 is electrically connected to the drain of the eleventh transistor Q11 through the twenty-seventh resistor R27 and the second diode D2.

The second voltage output terminal OUT2 is electrically connected to the ground terminal GND through the second capacitor C2.

When the electric appliance is not electrically connected to the power output terminal Vout for charging, the voltage value of the power output terminal Vout is maintained above the activation threshold. Hence, the voltage outputted from the power output terminal Vout can be sent to the control terminal of the switching unit U1 through the twenty-second resistor R22, such that the switching unit U1 can stay at a turn-on condition, allowing the eleventh transistor Q11 to stay at a turn-off condition with the gate of the eleventh transistor Q11 grounded. Furthermore, when the eleventh resistor Q11 stays at the turn-off condition, the bases of the ninth transistor Q9 and the tenth transistor Q10 fail to be grounded, such that the ninth transistor Q9 and the tenth transistor Q10 also stay at the turn-off condition.

At the moment, as the ninth transistor Q9 and the tenth transistor Q10 stay at the turn-off condition, the first voltage output terminal OUT1 and the second voltage output terminal OUT2 fail to be connected to the electronic circuit breaker 12 through the ninth transistor Q9 and the tenth transistor Q10. As such, the electronic circuit breaker 12 fails to receive the power outputted from the power converter 11, thereby reducing the power consumption of the electronic circuit breaker 12 during the standby mode.

However, when the electric appliance is initially electrically connected to the power output terminal Vout, the voltage value of the power output terminal Vout will drop. Consequently, the voltage value to the control terminal of the switching unit U1 is reduced, allowing the switching unit to turn off. When the switching unit U1 turns off, the second voltage output terminal OUT2 is sequentially connected with the twenty-third resistor R23, the fourth diode D4, and the twenty-eighth resistor R28 to form a loop with current generated and flowing through the loop for the eleventh transistor Q11 to be turned on. When the eleventh transistor Q11 is turned on, the ninth transistor Q9 and the tenth transistor Q10 are also turned on.

Meanwhile, as the ninth transistor Q9 and the tenth transistor Q10 are both turned on, the first voltage output terminal OUT1 and the second voltage output terminal OUT2 can be connected to the electronic circuit breaker 12 for the electronic circuit breaker 12 to normally operate with the power received from the power converter 11.

Besides, when the electric appliance is electrically connected to the power output terminal for charging, the voltage value of the power output terminal Vout is the same as that of the second voltage output terminal OUT2, meaning that the switching unit U1 will be turned on. However, when the electric appliance is electrically connected to the power output terminal Vout for charging, the first output terminal O/P1 of the processor unit 121 of the electronic circuit breaker 12 outputs the activation signal, and the first output terminal O/P1 of the processor unit 121 is electrically connected to the gate of the eleventh transistor Q11 through the third diode D3. Therefore, the eleventh transistor Q11 can stay at a turn-on condition by receiving the activation signal outputted from the first output terminal O/P1 of the processor unit 121, and the power from the power converter 11 can be outputted to the electronic circuit breaker 12 through the ninth transistor Q9 and the tenth transistor Q10 which are turned on to maintain normal operation of the electronic circuit breaker 12.

Figure 9:
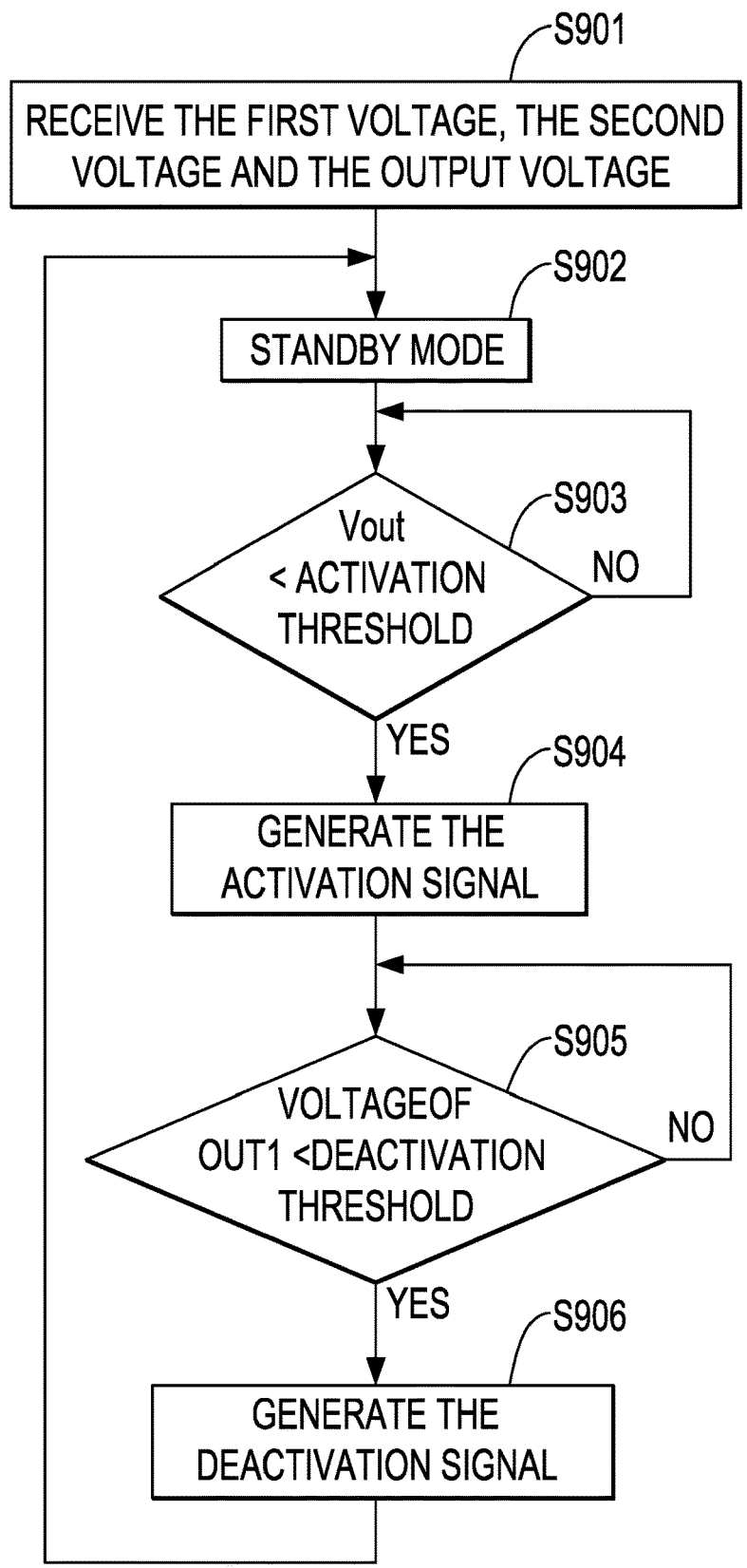
FIG. 9 is a flow diagram of a first embodiment of a method for controlling a power device with an electronic circuit breaker in accordance with the present invention.

With reference to FIG. 9, a first embodiment of a method for controlling the foregoing power supply devices in accordance with the present invention is performed by the electronic circuit breaker 13 and includes the following steps.

Step S901: Receive the first voltage outputted from the first voltage output terminal OUT1 of the power converter 11 and the second voltage outputted from the second voltage output terminal OUT2 and receive the output voltage of the power output terminal Vout. The power converter 11 performs a feedback control according to the second voltage outputted from the second voltage output terminal OUT2.

Step S902: Perform the standby mode.

Step S903: Determine if the voltage value of the output voltage of the power output terminal Vout is less than the activation threshold. When the voltage value of the output voltage of the power output terminal Vout is less than the activation threshold, perform step S904. Otherwise, resume step S903.

Step S904: generate the activation signal to connect the second voltage output terminal OUT2 to the power output terminal Vout.

Step S905: Determine if the voltage value of the first voltage of the first voltage output terminal OUT1 is less than the deactivation threshold. When the voltage value of the first voltage of the first voltage output terminal OUT1 is less than the deactivation threshold, perform step S906. Otherwise, resume step S905.

Step S906: Generate the deactivation signal to disconnect the second output voltage terminal OUT2 from the power output terminal Vout. After completion of step S906, resume step S902.

Figure 10:
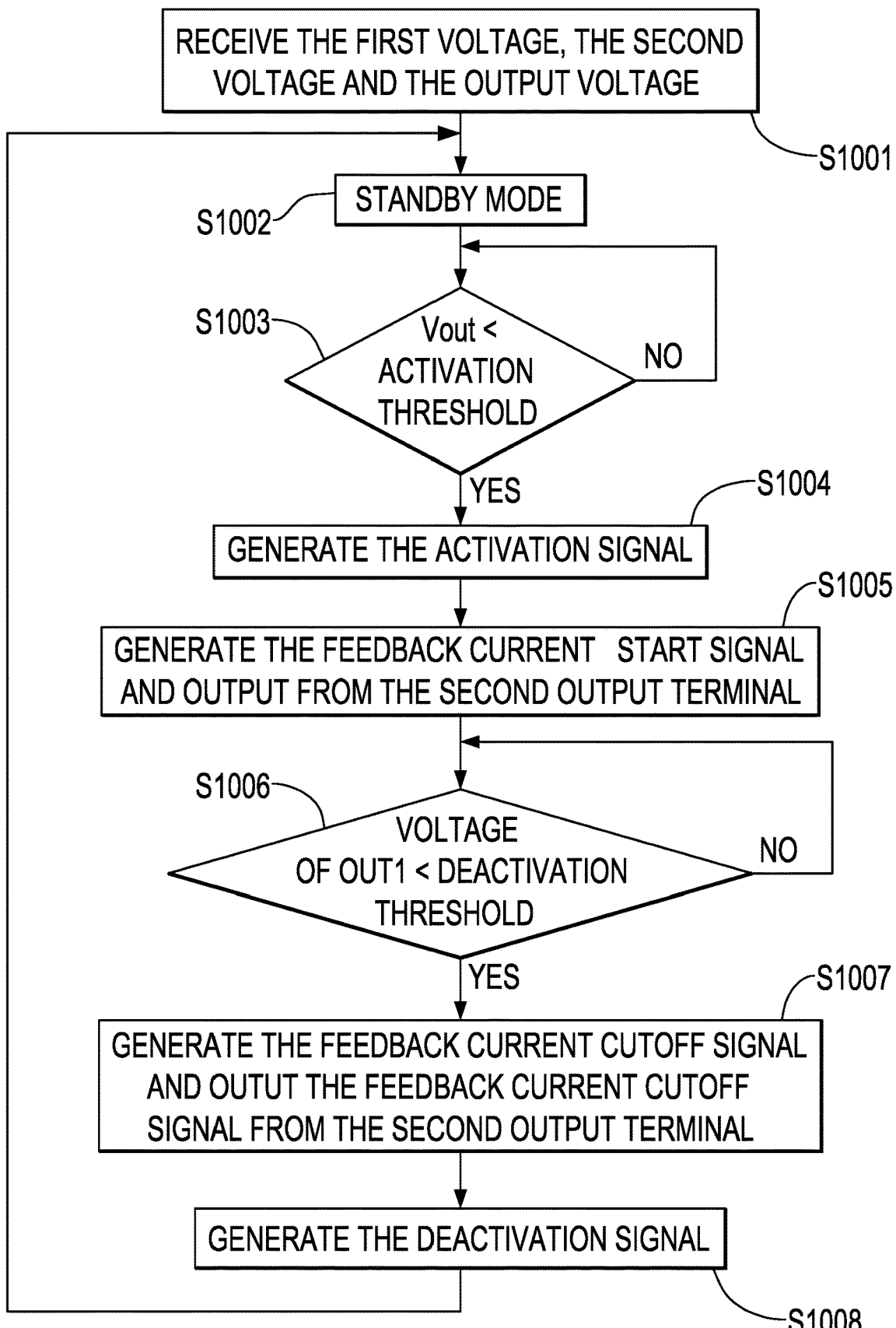
FIG. 10 is a flow diagram of a second embodiment of a method for controlling a power device with an electronic circuit breaker in accordance with the present invention.

With reference to FIG. 10, a second embodiment of a method for controlling the foregoing power supply devices in accordance with the present invention is performed by the electronic circuit breaker 13 and includes the following steps.

Step S1001: Receive the first voltage outputted from the first voltage output terminal OUT1 of the power converter 11 and the second voltage outputted from the second voltage output terminal OUT2 and receive the output voltage of the power output terminal Vout. The power converter 11 performs a feedback control according to the second voltage outputted from the second voltage output terminal OUT2.

Step S1002: Perform the standby mode.

Step S1003: Determine if the voltage value of the output voltage of the power output terminal Vout is less than the activation threshold. When the voltage value of the output voltage of the power output terminal Vout is less than the activation threshold, perform step S1004. Otherwise, resume step S1003.

Step S1004: Generate the activation signal to connect the second voltage output terminal OUT2 to the power output terminal Vout.

Step S1005: Generate the feedback current start signal to output a feedback current from the second voltage output terminal OUT2 to the power output terminal Vout.

Step S1006: Determine if the voltage value of the first voltage of the first voltage output terminal OUT1 is less than the deactivation threshold. When the voltage value of the first voltage of the first voltage output terminal OUT1 is less than the deactivation threshold, perform step S1007. Otherwise, resume step S1006.

Step S1007: Generate the feedback current cutoff signal and output the feedback current cutoff signal from the second output terminal to stop from generating the feedback current.

Step S1008: Generate the deactivation signal to disconnect the second output voltage terminal OUT2 from the power output terminal Vout. After completion of step S1008, resume step S1002.

Figure 11:
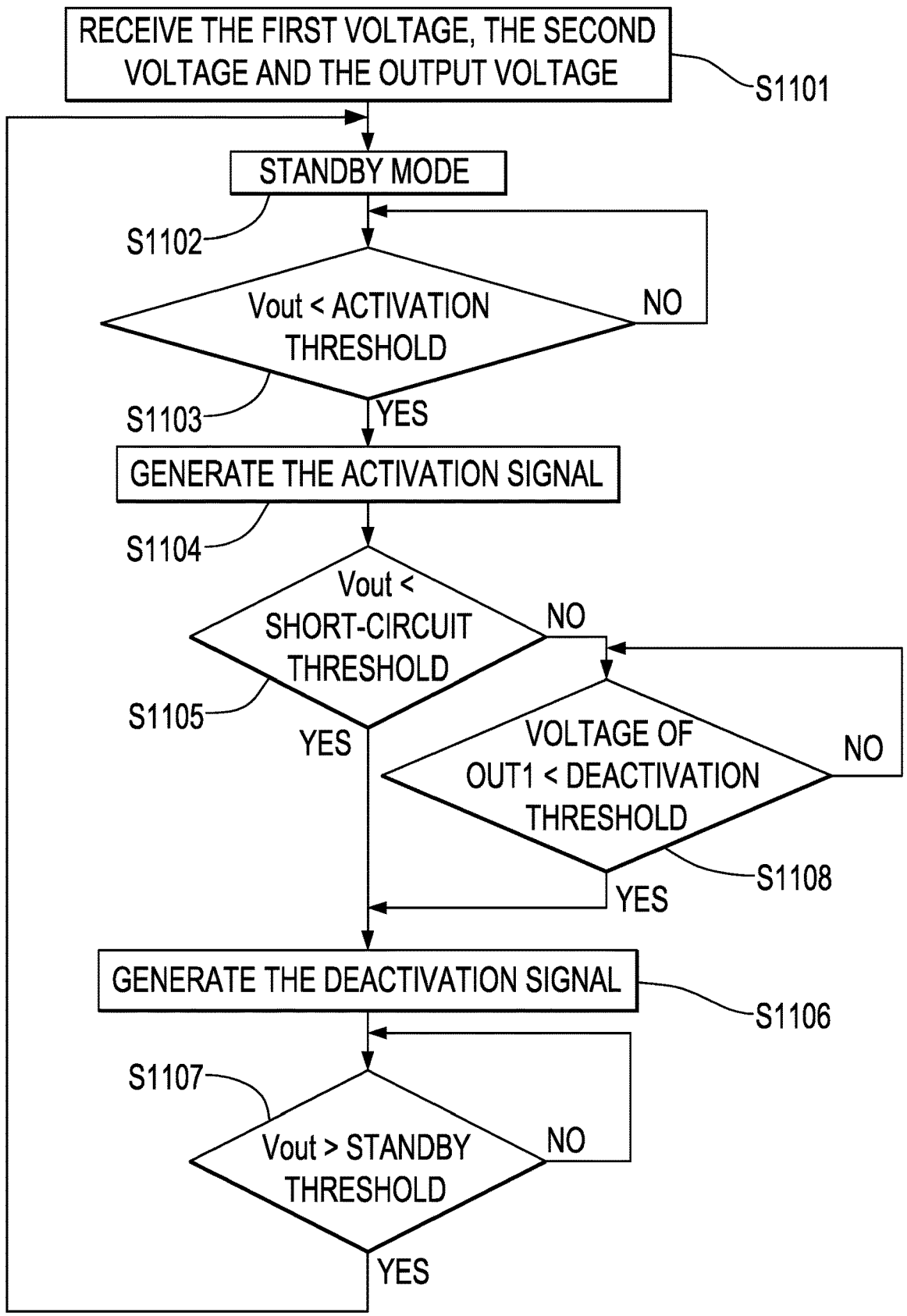
FIG. 11 is a flow diagram of a third embodiment of a method for controlling a power device with an electronic circuit breaker in accordance with the present invention.

With reference to FIG. 11, a third embodiment of a method for controlling the foregoing power supply devices in accordance with the present invention is performed by the electronic circuit breaker 13 and includes the following steps.

Step S1101: Receive the first voltage outputted from the first voltage output terminal OUT1 of the power converter 11 and the second voltage outputted from the second voltage output terminal OUT2 and receive the output voltage of the power output terminal Vout. The power converter 11 performs a feedback control according to the second voltage outputted from the second voltage output terminal OUT2.

Step S1102: Perform the standby mode.

Step S1103: Determine if the voltage value of the output voltage of the power output terminal Vout is less than the activation threshold. When the voltage value of the output voltage of the power output terminal Vout is less than the activation threshold, perform step S1104. Otherwise, resume step S1103.

Step S1104: Generate the activation signal to connect the second voltage output terminal OUT2 to the power output terminal Vout.

Step S1105: Determine if the voltage value of the output voltage of the power output terminal Vout is less than the short-circuit threshold. When the voltage value of the output voltage of the power output terminal Vout is less than the short-circuit threshold, perform step S1106. Otherwise, perform step S1108.

Step S1106: Generate the deactivation signal to disconnect the second output voltage terminal OUT2 from the power output terminal Vout.

Step S1107: Determine if the voltage value of the output voltage of the power output terminal Vout is greater than the standby threshold. When the voltage value of the output voltage of the power output terminal Vout is greater than the standby threshold, perform step S1102. Otherwise, resume step S1107.

Step S1108: Determine if the voltage value of the first voltage of the first voltage output terminal OUT1 is less than the deactivation threshold. When the voltage value of the first voltage of the first voltage output terminal OUT1 is less than the deactivation threshold, perform step S1106. Otherwise, resume step S1108.

Figure 12:
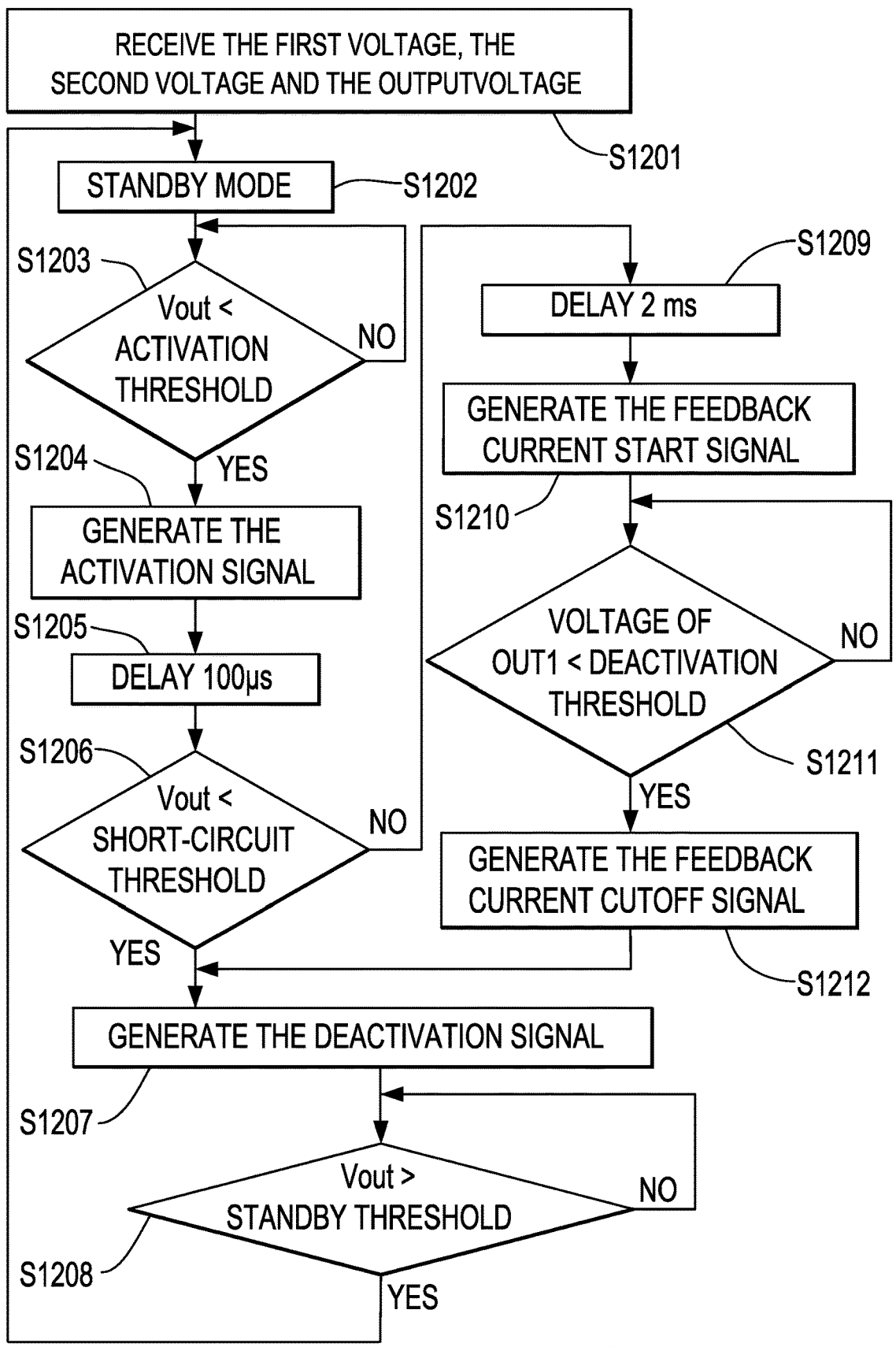
FIG. 12 is a flow diagram of a fourth embodiment of a method for controlling a power device with an electronic circuit breaker in accordance with the present invention.

With reference to FIG. 12, a fourth embodiment of a method for controlling the foregoing power supply devices in accordance with the present invention is performed by the electronic circuit breaker 13 and includes the following steps.

Step S1201: Receive the first voltage outputted from the first voltage output terminal OUT1 of the power converter 11 and the second voltage outputted from the second voltage output terminal OUT2 and receive the output voltage of the power output terminal Vout. The power converter 11 performs a feedback control according to the second voltage outputted from the second voltage output terminal OUT2.

Step S1202: Perform the standby mode.

Step S1203: Determine if the voltage value of the output voltage of the power output terminal Vout is less than the activation threshold. When the voltage value of the output voltage of the power output terminal Vout is less than the activation threshold, perform step S1104. Otherwise, resume step S1103.

Step S1204: Generate the activation signal to connect the second voltage output terminal OUT2 to the power output terminal Vout.

Step S1205: Delay a first time duration.

Step S1206: Determine if the voltage value of the output voltage of the power output terminal Vout is less than the short-circuit threshold. When the voltage value of the output voltage of the power output terminal Vout is less than the short-circuit threshold, perform step S1207. Otherwise, perform step S1209.

Step S1207: Generate the deactivation signal to disconnect the second output voltage terminal OUT2 from the power output terminal Vout.

Step S1208: Determine if the voltage value of the output voltage of the power output terminal Vout is greater than the standby threshold. When the voltage value of the output voltage of the power output terminal Vout is greater than the standby threshold, perform step S1202. Otherwise, resume step S1208.

Step S1209: Delay a second time duration.

Step S1210: Generate the feedback current start signal to output a feedback current from the second voltage output terminal OUT2 to the power output terminal Vout.

Step S1211: Determine if the voltage value of the first voltage of the first voltage output terminal OUT1 is less than the deactivation threshold. When the voltage value of the first voltage of the first voltage output terminal OUT1 is less than the deactivation threshold, perform step S1212. Otherwise, resume step S1211.

Step S1212: Generate the feedback current cutoff signal and output the feedback current cutoff signal from the second output terminal to stop from generating the feedback current. After completion of step S1212, perform step S1207.

In the present embodiment, the first duration is 100 μs (microsecond), and the second time duration is 2 ms (millisecond).

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A power supply device, comprising:
   a power output terminal;
   a power converter having a first voltage output terminal and a second voltage output terminal, wherein the power converter performs a feedback control according to a voltage outputted from the second voltage output terminal, and the power output terminal is connected to the second voltage output terminal through a voltage divider circuit; and
   an electronic circuit breaker having:
   an electronic switch connected between the power output terminal and the second voltage output terminal and having a control terminal for turning on or off the electronic switch;
   a processor unit having:
   a first input terminal and a second input terminal respectively connected to the first voltage output terminal and the second voltage output terminal;
   a third input terminal connected to the power output terminal; and
   a first output terminal connected to the control terminal of the electronic switch;
   wherein
   the processor unit performs a standby mode, determines if a voltage value of the power output terminal is less than an activation threshold, when determining that the voltage value of the power output terminal is less than the activation threshold, the processor unit generates an activation signal and outputs the activation signal from the first output terminal to turn on the electronic switch and connect the second voltage output terminal and the power output terminal, the processor unit further determines if a voltage value of the first voltage output terminal of the power converter is less than a deactivation threshold, and when determining that the voltage value of the first voltage output terminal of the power converter is less than the deactivation threshold, the processor unit generates a deactivation signal and outputs the deactivation signal from the first output terminal to turn off the electronic switch and resumes the standby mode.

2. The power supply device as claimed in claim 1, wherein the power converter includes:
   a primary loop unit adapted to electrically connect to a power source to receive power supplied from the power source;
   a primary coil electrically connected to the primary loop unit;
   a first secondary coil inductively coupled to the primary coil, connected to the first voltage output terminal, and outputting a first voltage through the first voltage output terminal;
   a second secondary coil inductively coupled to the primary coil, connected to the second voltage output terminal, and outputting a second voltage through the second voltage output terminal, wherein the first secondary coil is greater than the second secondary coil in number of turns; and
   a control unit electrically connected to the second secondary coil and the primary loop unit, and generating a control signal to control the primary loop unit according to the second voltage outputted from the second secondary coil.

3. The power supply device as claimed in claim 2, further comprising a standby power controller, wherein
the electronic switch is connected to the second voltage output terminal of the power converter through the standby power controller, and the standby power controller is connected to the power output terminal;
the first input terminal of the processor unit of the electronic circuit breaker is connected to the first voltage output terminal of the power converter through the standby power controller;
the second input terminal of the processor unit of the electronic circuit breaker is directly connected to the second voltage output terminal of the power converter; and
when the voltage value of the power output terminal is greater than the activation threshold, the standby power controller disconnects the power converter from the electronic circuit breaker.

4. The power supply device as claimed in claim 3, wherein the standby power controller includes:
a ninth transistor having:
an emitter electrically connected to the first voltage output terminal;
a base; and
a collector electrically connected to the first input terminal of the processor unit of the electronic circuit breaker;
a tenth transistor having:
an emitter electrically connected to the second voltage output terminal;
a base; and
a collector electrically connected to the electronic switch;
an eleventh transistor having:
a drain electrically connected to the base of the ninth transistor and the base of the tenth transistor;
a gate; and
a source electrically connected to the ground terminal; and
a switching unit connected between the second voltage output terminal and the ground terminal and having a control terminal for turning on or off the switching unit, wherein the power output terminal is electrically connected to the control terminal of the switching unit;
wherein the gate of the eleventh transistor is electrically connected to a node connected to the switching unit and the second voltage output terminal and is electrically connected to the first input terminal of the processor unit of the electronic circuit breaker.

5. The power supply device as claimed in claim 1, wherein the electronic circuit breaker further includes a switching circuit, wherein the first output terminal of the processor unit is connected to the control terminal of the electronic switch through the switching circuit, and the switching circuit includes:
a first transistor having:
a drain;
a gate electrically connected to the first output terminal of the processor unit; and
a source electrically connected to a ground terminal;
a second transistor having:
an emitter electrically connected to the first voltage output terminal;
a base electrically connected to the drain of the first transistor; and
a collector; and
a third transistor having:
an emitter electrically connected to the control terminal of the electronic switch;
a base electrically connected to the collector of the second transistor; and
a collector electrically connected to the first voltage output terminal.

6. The power supply device as claimed in claim 5, wherein the electronic switch includes:
a fourth transistor having:
a drain electrically connected to the second voltage output terminal;
a gate electrically connected to the emitter of the third transistor and being the control terminal of the electronic switch; and
a source electrically connected to the power output terminal; and
a first resistor electrically connected between the gate and the source of the fourth transistor.

7. The power supply device as claimed in claim 6, wherein the electronic circuit breaker further includes a feedback current generation circuit, and the feedback current generation circuit has:
a seventh transistor having:
a drain;
a gate electrically connected to a second output terminal of the processor unit; and
a source electrically connected to the ground terminal; and
an eighth transistor having:
an emitter electrically connected to the first voltage output terminal;
a base electrically connected to the drain of the seventh transistor; and
a collector electrically connected to the power output terminal through a fifth resistor;
wherein when determining that the voltage value of the first voltage output terminal is less than the deactivation threshold, the processor unit generates a feedback current cutoff signal and outputs the feedback current cutoff signal from the second output terminal to turn off the seventh transistor and the eighth transistor.

8. The power supply device as claimed in claim 7, further comprising a standby power controller, wherein
the electronic switch is connected to the second voltage output terminal of the power converter through the standby power controller, and the standby power controller is connected to the power output terminal;
the first input terminal of the processor unit of the electronic circuit breaker is connected to the first voltage output terminal of the power converter through the standby power controller;
the second input terminal of the processor unit of the electronic circuit breaker is directly connected to the second voltage output terminal of the power converter; and
when the voltage value of the power output terminal is greater than the activation threshold, the standby power controller disconnects the power converter from the electronic circuit breaker.

9. The power supply device as claimed in claim 8, wherein the standby power controller includes:
a ninth transistor having:

an emitter electrically connected to the first voltage output terminal;
a base; and
a collector electrically connected to the first input terminal of the processor unit of the electronic circuit breaker;
a tenth transistor having:
an emitter electrically connected to the second voltage output terminal;
a base; and
a collector electrically connected to the electronic switch;
an eleventh transistor having:
a drain electrically connected to the base of the ninth transistor and the base of the tenth transistor;
a gate; and
a source electrically connected to the ground terminal; and
a switching unit connected between the second voltage output terminal and the ground terminal and having a control terminal for turning on or off the switching unit, wherein the power output terminal is electrically connected to the control terminal of the switching unit;
wherein the gate of the eleventh transistor is electrically connected to a node connected to the switching unit and the second voltage output terminal and is electrically connected to the first input terminal of the processor unit of the electronic circuit breaker.

10. The power supply device as claimed in claim 6, further comprising a standby power controller, wherein
the electronic switch is connected to the second voltage output terminal of the power converter through the standby power controller, and the standby power controller is connected to the power output terminal;
the first input terminal of the processor unit of the electronic circuit breaker is connected to the first voltage output terminal of the power converter through the standby power controller;
the second input terminal of the processor unit of the electronic circuit breaker is directly connected to the second voltage output terminal of the power converter; and
when the voltage value of the power output terminal is greater than the activation threshold, the standby power controller disconnects the power converter from the electronic circuit breaker.

11. The power supply device as claimed in claim 10, wherein the standby power controller includes:
a ninth transistor having:
an emitter electrically connected to the first voltage output terminal;
a base; and
a collector electrically connected to the first input terminal of the processor unit of the electronic circuit breaker;
a tenth transistor having:
an emitter electrically connected to the second voltage output terminal;
a base; and
a collector electrically connected to the electronic switch;
an eleventh transistor having:
a drain electrically connected to the base of the ninth transistor and the base of the tenth transistor;
a gate; and
a source electrically connected to the ground terminal; and
a switching unit connected between the second voltage output terminal and the ground terminal and having a control terminal for turning on or off the switching unit, wherein the power output terminal is electrically connected to the control terminal of the switching unit;
wherein the gate of the eleventh transistor is electrically connected to a node connected to the switching unit and the second voltage output terminal and is electrically connected to the first input terminal of the processor unit of the electronic circuit breaker.

12. The power supply device as claimed in claim 5, further comprising a standby power controller, wherein
the electronic switch is connected to the second voltage output terminal of the power converter through the standby power controller, and the standby power controller is connected to the power output terminal;
the first input terminal of the processor unit of the electronic circuit breaker is connected to the first voltage output terminal of the power converter through the standby power controller;
the second input terminal of the processor unit of the electronic circuit breaker is directly connected to the second voltage output terminal of the power converter; and
when the voltage value of the power output terminal is greater than the activation threshold, the standby power controller disconnects the power converter from the electronic circuit breaker.

13. The power supply device as claimed in claim 12, wherein the standby power controller includes:
a ninth transistor having:
an emitter electrically connected to the first voltage output terminal;
a base; and
a collector electrically connected to the first input terminal of the processor unit of the electronic circuit breaker;
a tenth transistor having:
an emitter electrically connected to the second voltage output terminal;
a base; and
a collector electrically connected to the electronic switch;
an eleventh transistor having:
a drain electrically connected to the base of the ninth transistor and the base of the tenth transistor;
a gate; and
a source electrically connected to the ground terminal; and
a switching unit connected between the second voltage output terminal and the ground terminal and having a control terminal for turning on or off the switching unit, wherein the power output terminal is electrically connected to the control terminal of the switching unit;
wherein the gate of the eleventh transistor is electrically connected to a node connected to the switching unit and the second voltage output terminal and is electrically connected to the first input terminal of the processor unit of the electronic circuit breaker.

14. The power supply device as claimed in claim 1, further comprising a standby power controller, wherein
the electronic switch is connected to the second voltage output terminal of the power converter through the standby power controller, and the standby power controller is connected to the power output terminal;

the first input terminal of the processor unit of the electronic circuit breaker is connected to the first voltage output terminal of the power converter through the standby power controller;

the second input terminal of the processor unit of the electronic circuit breaker is directly connected to the second voltage output terminal of the power converter; and when the voltage value of the power output terminal is greater than the activation threshold, the standby power controller disconnects the power converter from the electronic circuit breaker.

15. The power supply device as claimed in claim 14, wherein the standby power controller includes:
   a ninth transistor having:
      an emitter electrically connected to the first voltage output terminal;
      a base; and
      a collector electrically connected to the first input terminal of the processor unit of the electronic circuit breaker;
   a tenth transistor having:
      an emitter electrically connected to the second voltage output terminal;
      a base; and
      a collector electrically connected to the electronic switch;
   an eleventh transistor having:
      a drain electrically connected to the base of the ninth transistor and the base of the tenth transistor;
      a gate; and
      a source electrically connected to the ground terminal; and
   a switching unit connected between the second voltage output terminal and the ground terminal and having a control terminal for turning on or off the switching unit, wherein the power output terminal is electrically connected to the control terminal of the switching unit;
   wherein the gate of the eleventh transistor is electrically connected to a node connected to the switching unit and the second voltage output terminal and is electrically connected to the first input terminal of the processor unit of the electronic circuit breaker.

16. A method for controlling a power supply device, wherein the power supply device includes a power output terminal, a power converter and an electronic circuit breaker and the power converter includes a first voltage output terminal and a second voltage output terminal; the method performed by the electronic circuit breaker and comprising:
   receiving a first voltage outputted from a first voltage output terminal of the power converter and the second voltage outputted from the second voltage output terminal of the power converter;
   receiving an output voltage of the power output terminal, wherein the power output terminal is connected to the second voltage output terminal through a voltage divider;
   performing a standby mode;
   determining if a voltage value of the output voltage of the power output terminal is less than an activation threshold;
   when the voltage value of the output voltage of the power output terminal is less than the activation threshold, generating an activation signal to connect the second voltage output terminal to the power output terminal;
   determining if a voltage value of the first voltage of the first voltage output terminal is less than a deactivation threshold;
   when the voltage value of the first voltage of the first voltage output terminal is less than the deactivation threshold, generating a deactivation signal to disconnect the second output voltage terminal from the power output terminal and then performing the standby mode.

17. The method as claimed in claim 16, comprising:
   when the voltage value of the output voltage of the power output terminal is less than the activation threshold, generating a feedback current start signal to output a feedback current from the second voltage output terminal to the power output terminal; and
   when the voltage value of the output voltage of the power output terminal is less than the deactivation threshold, generating a feedback current cutoff signal to stop from generating the feedback current.

18. The method as claimed in claim 16, comprising:
   after the activation signal is generated, determining if the voltage value of the output voltage of the power output terminal is less than a short-circuit threshold;
   when the voltage value of the output voltage of the power output terminal is less than the short-circuit threshold, generating the deactivation signal to disconnect the second output voltage terminal from the power output terminal and determining if the voltage value of the output voltage of the power output terminal is greater than a standby threshold;
   when the voltage value of the output voltage of the power output terminal is greater than the standby threshold, performing the standby mode; and
   when the voltage value of the output voltage of the power output terminal is not less than the short-circuit threshold, determining if the voltage value of the first voltage of the first voltage output terminal is less than the deactivation threshold.

* * * * *